(12) United States Patent
Lin

(10) Patent No.: US 9,699,884 B2
(45) Date of Patent: Jul. 4, 2017

(54) LATCH DEVICE FOR HEAT DISSIPATION UNIT

(71) Applicant: ASIA VITAL COMPONENTS CO., LTD., New Taipei (TW)

(72) Inventor: Sheng-Huang Lin, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 0 days.

(21) Appl. No.: 14/882,395

(22) Filed: Oct. 13, 2015

(65) Prior Publication Data

US 2017/0105279 A1 Apr. 13, 2017

(51) Int. Cl.
*H05K 1/02* (2006.01)
*H05K 1/18* (2006.01)

(52) U.S. Cl.
CPC ......... *H05K 1/0203* (2013.01); *H05K 1/0201* (2013.01); *H05K 1/18* (2013.01);
(Continued)

(58) Field of Classification Search
CPC ........... H05K 1/0203; H05K 2201/066; H05K 2201/10598; H05K 1/0201; H05K 1/0204; H05K 1/0206; H05K 1/0207; H05K 1/0209; H05K 1/021; H05K 1/0212; H05K 1/0272; H05K 1/05; H05K 2201/064; H05K 2201/068; H05K 2201/09; H05K 7/205; H05K 2201/10393; H05K 7/2039; H05K 7/20418; H05K 7/20427; H05K 7/20436; H05K 7/20445; H05K 7/20454; H05K 7/20463; H05K 7/20472; H05K 7/20481; H05K 7/2049; H05K 7/20509; H05K 7/20518; H05K 7/20854; H05K 7/20863;
(Continued)

(56) References Cited

U.S. PATENT DOCUMENTS 6,430,049 B1 * 8/2002 Lai .................. H01L 23/4093
                                                       165/80.3
6,625,021 B1    9/2003 Lofland et al.
(Continued)

FOREIGN PATENT DOCUMENTS

| CN | 2691052 | 4/2005 |
|---|---|---|
| TW | 566829 | 12/2003 |
| TW | M521716 | 5/2016 |

*Primary Examiner* — Ishwarbhai B Patel
(74) *Attorney, Agent, or Firm* — Jackson IPG PLLC; Demian K. Jackson

(57) ABSTRACT

A latch device for heat dissipation unit is applied to and mounted on a motherboard in tight contact with at least one heat source. The latch device includes a heat sink, a first elastic abutment member having a first protrusion block and a second elastic abutment member having a second protrusion block. A first latch member and a second latch member are disposed on two opposite sides of the heat sink. The first and second latch members are freely latchable with the corresponding first and second protrusion blocks or unlatchable from the corresponding first and second protrusion blocks. Accordingly, along with the latching or unlatching, the first and second elastic abutment members are elastically deformed into abutment against or out of abutment with the other face of the heat sink. Therefore, the heat sink can be easily and securely fixed on or detached from the motherboard.

15 Claims, 15 Drawing Sheets

(52) U.S. Cl.
CPC ........... *H05K 1/0212* (2013.01); *H05K 1/181* (2013.01); *H05K 2201/066* (2013.01); *H05K 2201/10598* (2013.01)

(58) Field of Classification Search
CPC ............... H05K 7/209; H05K 7/20909; H05K 7/20963; H05K 7/20972; H01L 2023/4062; H01L 2023/4068; H01L 23/40; H01L 23/4006
See application file for complete search history.

(56) References Cited

U.S. PATENT DOCUMENTS

| | | | |
|---|---|---|---|
| 7,327,575 B2* | 2/2008 | Yu | H01L 23/4093 165/80.3 |
| 7,746,646 B2* | 6/2010 | Kuo | H01L 23/4093 165/185 |

* cited by examiner

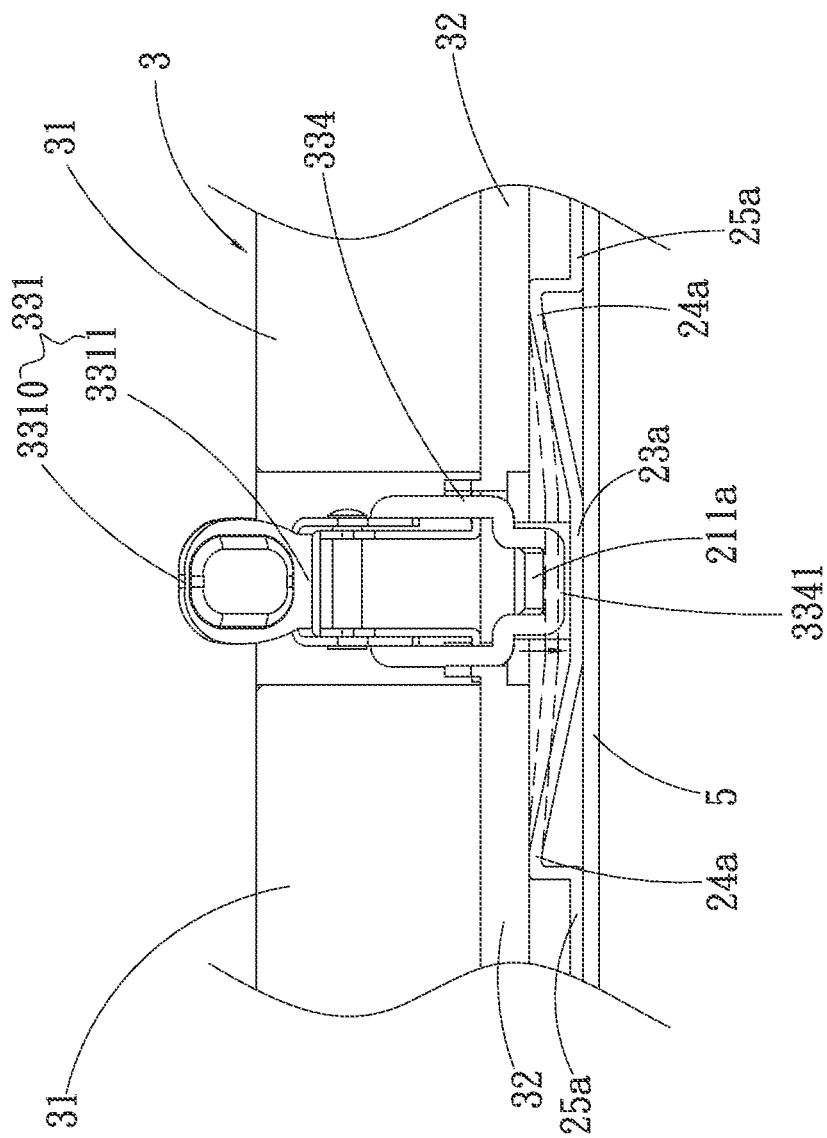

LATCH DEVICE FOR HEAT DISSIPATION UNIT

BACKGROUND OF THE INVENTION

1. Field of the Invention

The present invention relates generally to a latch device for heat dissipation unit, and more particularly to a latch device for heat dissipation unit, which is convenient to operate and assemble and is able to securely install a heat sink on an electronic component.

2. Description of the Related Art

Along with the rapid development of electronic information industries, the processing ability of various electronic components such as central processing unit has been continuously enhanced. As a result, the heat generated by the electronic components is also increased. The manufacturers often employ a metal heat sink with heat collection, heat transfer and heat dissipation functions to dissipate the heat. In order to quickly and fully dissipate the heat, it is necessary to fix the heat sink on the heat generation electronic component and keep the heat sink in tight contact with the electronic component. Therefore, a fixing device for heat dissipation unit is needed.

The conventional heat sink fixing device mainly includes a fixing seat on which a heat sink is positioned. Multiple screws are sequentially passed through the heat sink and the fixing seat and tightened with a hand tool (such as a screwdriver or a hexagonal wrench) to lock the heat sink on the fixing seat. Under such circumstance, the bottom of the heat sink is tightly and securely attached to a corresponding heat generation component (such as a central processing unit). Accordingly, in the case that a user has no hand tool at hand, it is impossible for the user to install the heat sink on the fixing seat or detach the heat sink from the fixing seat. Therefore, it is inconvenient to operate/assemble the conventional heat sink fixing device. Moreover, the force manually applied to the screws for tightening the screws varies with the users. Therefore, it often takes place that the screws are over-tightened to damage the heat sink or under-tightened to lead to detachment of the heat sink.

SUMMARY OF THE INVENTION

It is therefore a primary object of the present invention to provide a latch device for heat dissipation unit, which is convenient to operate and assemble and is able to securely latch a heat sink on an electronic component.

It is a further object of the present invention to provide the above latch device for heat dissipation unit, which can be barehanded operated to securely locate a heat sink on a motherboard without using any hand tool and make the heat sink tightly attach to at least one electronic component (or heat source) disposed on the motherboard.

To achieve the above and other objects, the latch device for heat dissipation unit of the present invention is applied to and mounted on a motherboard in tight contact with at least one heat source. The latch device for heat dissipation unit includes a heat sink, a first elastic abutment member and a second elastic abutment member. The first and second elastic abutment members are respectively disposed on an upper face of the motherboard corresponding to each other. The first and second elastic abutment members respectively have a first protrusion block and a second protrusion block opposite to the first protrusion block. The heat sink includes multiple radiating fins, a first latch member and a second latch member. The radiating fins are disposed on one face of the heat sink. The first and second latch members are respectively disposed on two opposite sides of the heat sink. The first and second latch members are respectively latchable with the corresponding first and second protrusion blocks or unlatchable from the corresponding first and second protrusion blocks. Therefore, along with the latching or unlatching, the first and second elastic abutment members can be elastically deformed into abutment against or out of abutment with the other face of the heat sink. Accordingly, the heat sink can be securely located on the motherboard or detached from the motherboard. The latch device for heat dissipation unit of the present invention is convenient to operate and assemble and is able to securely latch a heat sink on the heat source.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein:

FIG. 6A is a side view of the latch device for heat dissipation unit of the first embodiment of the present invention, showing that the latch device is applied to and mounted on the electronic component in an unlatched state;

DETAILED DESCRIPTION OF THE PREFERRED EMBODIMENTS

Figure 1:
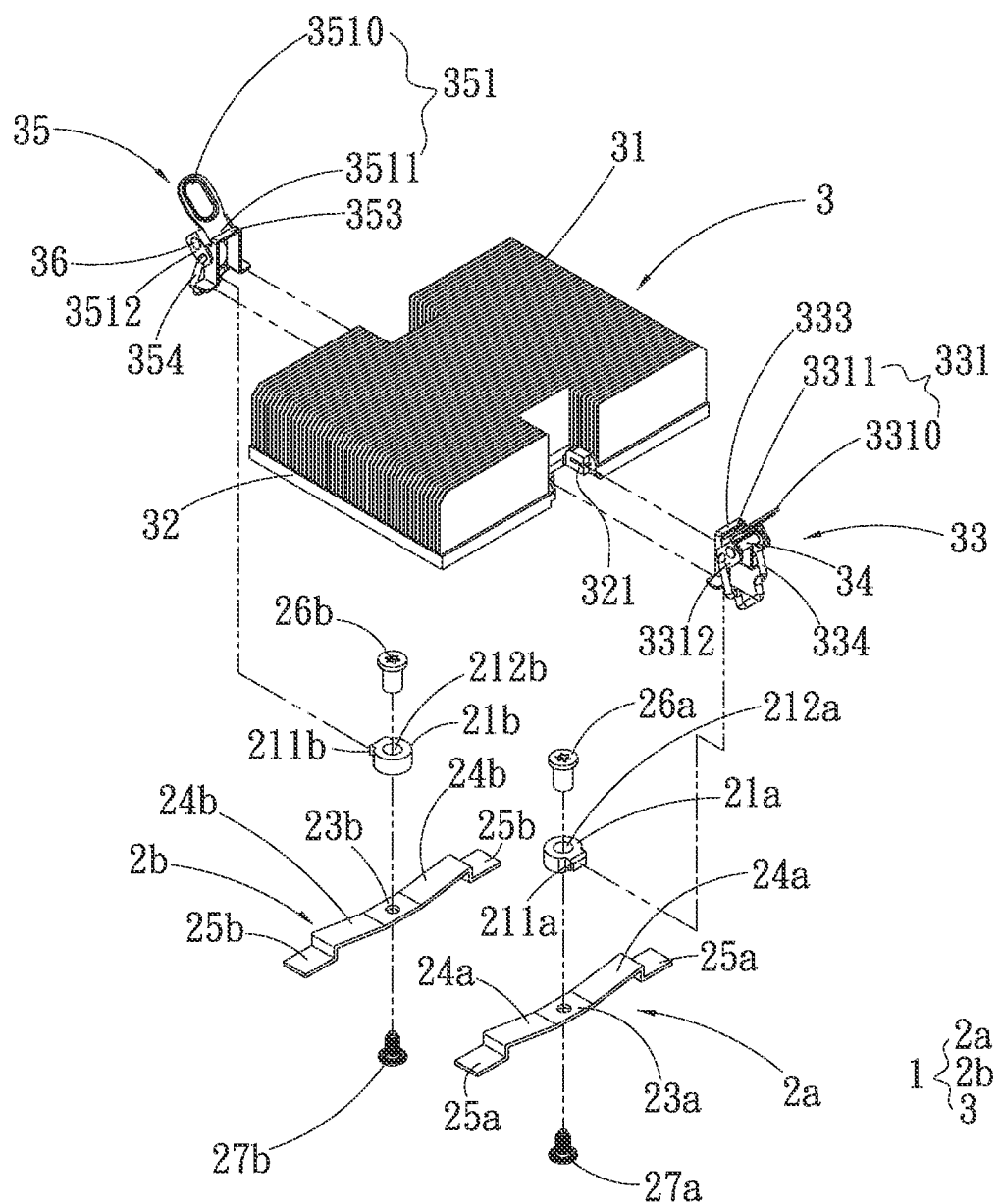
FIG. 1 is a perspective exploded view of a first embodiment of the present invention.
Figure 2A:
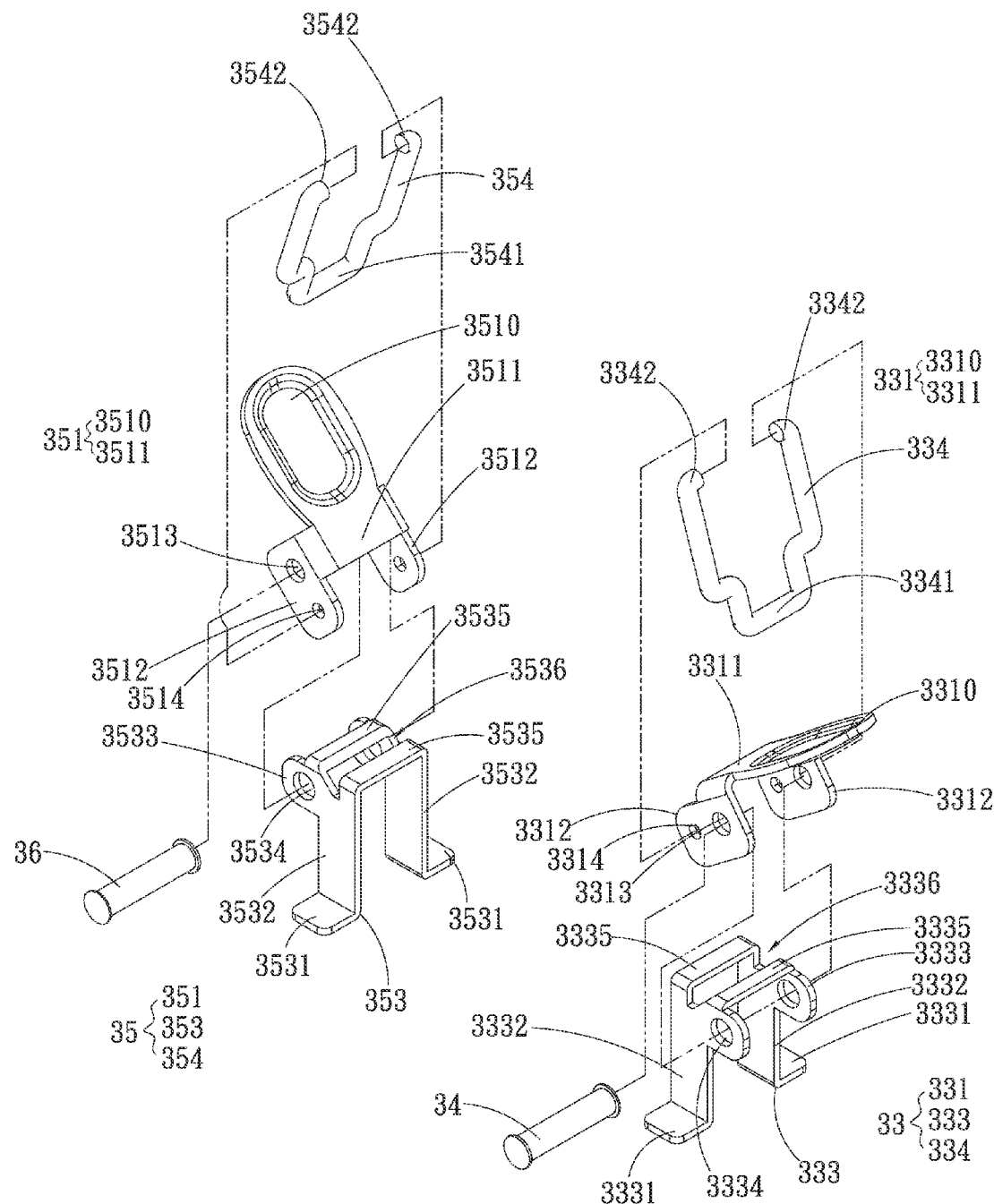
FIG. 2A is a perspective exploded view of the first and second latch members of the first embodiment of the present invention.
Figure 2B:
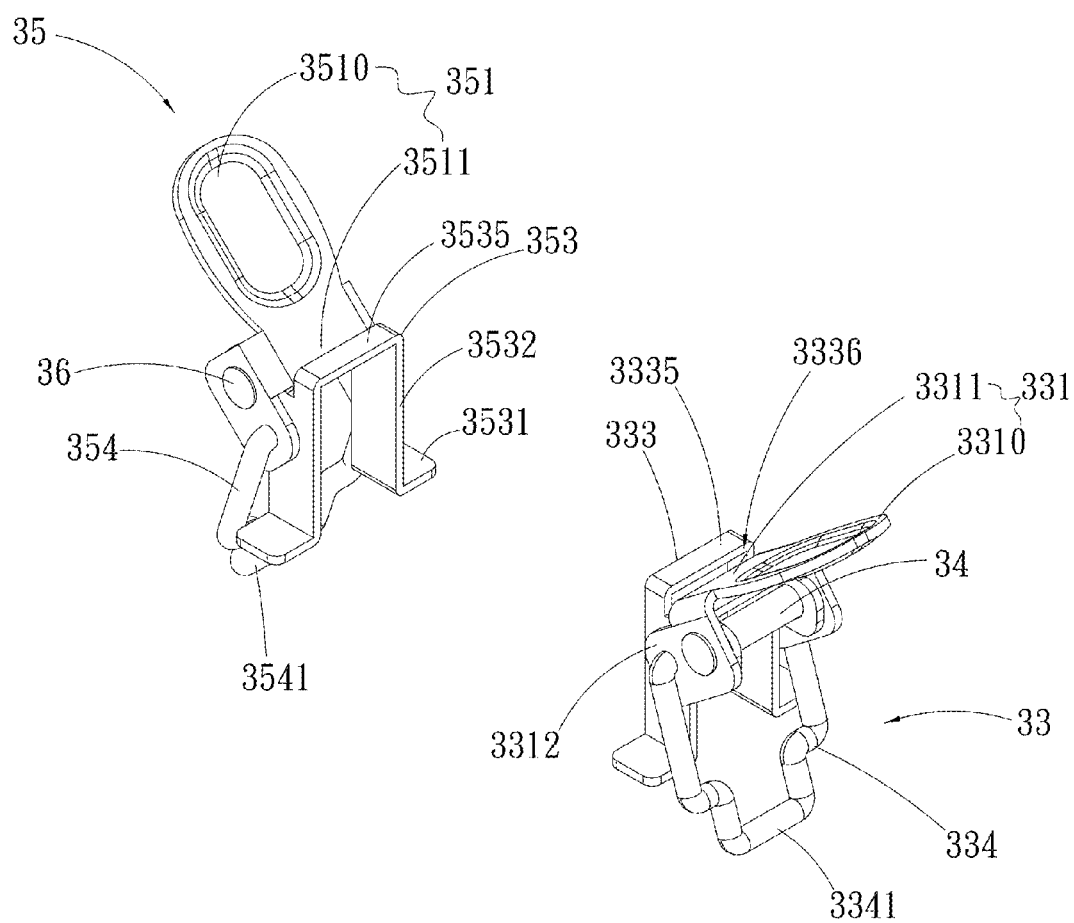
FIG. 2B is a perspective assembled view of the first and second latch members of the first embodiment of the present invention.
Figure 3A:
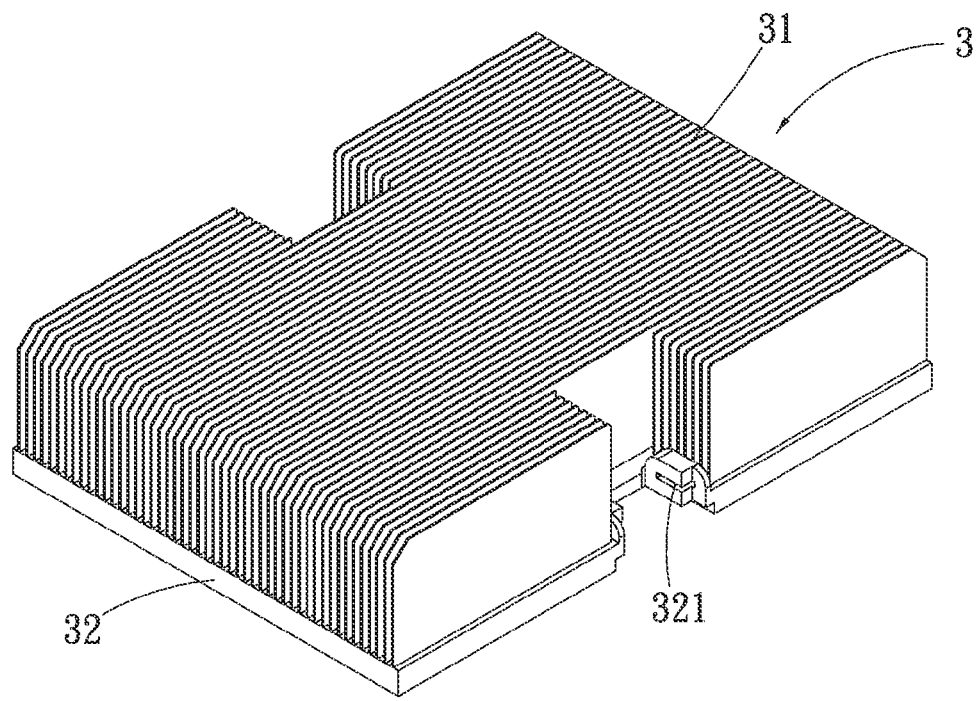
FIG. 3A is a perspective view of the heat sink of the first embodiment of the present invention.
Figure 3B:
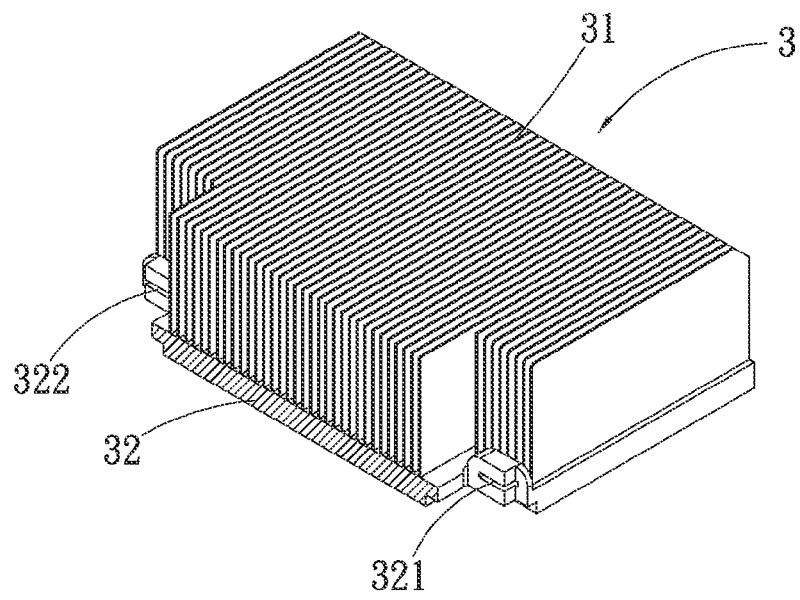
FIG. 3B is a perspective partially sectional view of the heat sink of the first embodiment of the present invention.
Figure 4:
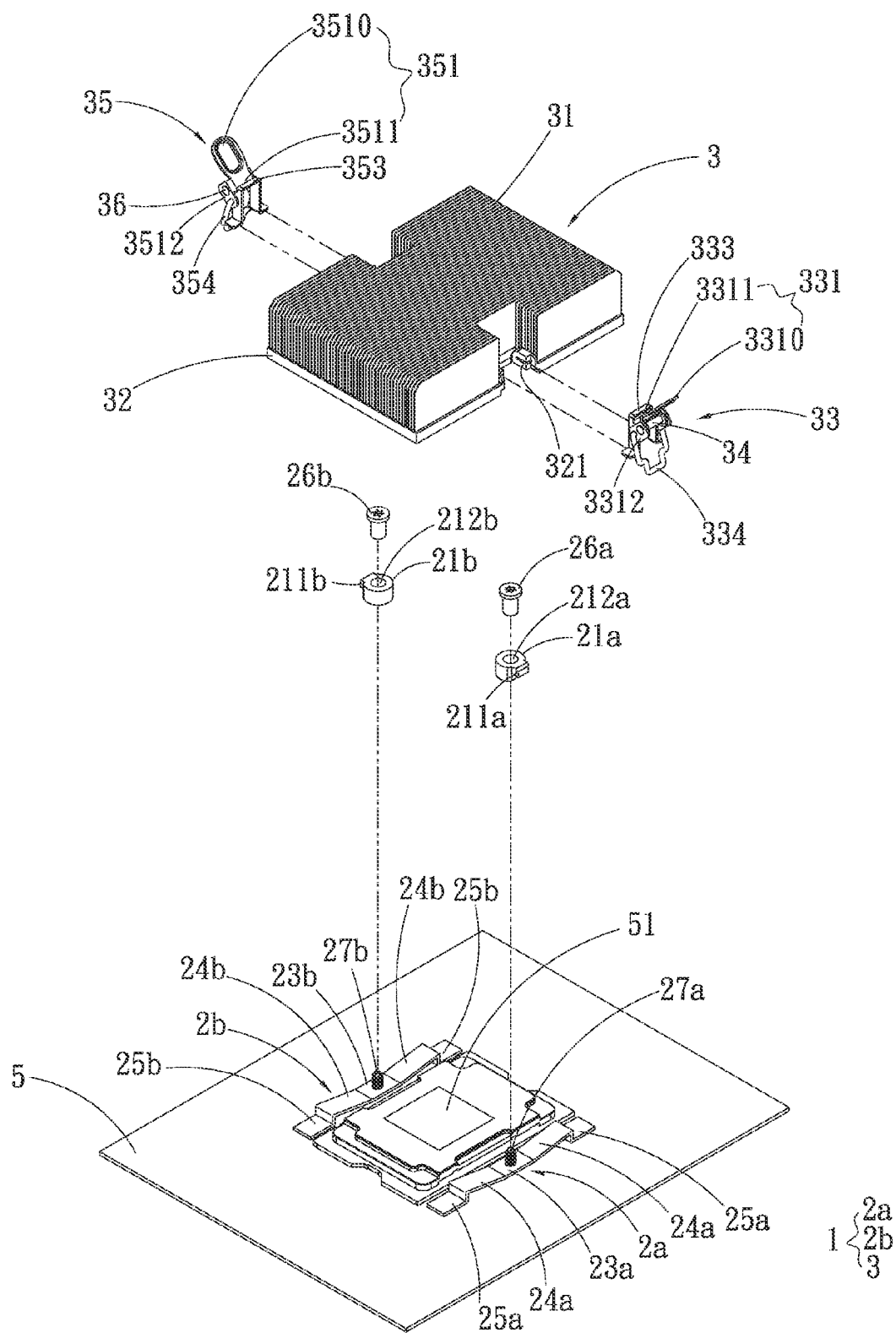
FIG. 4 is a perspective exploded view of the latch device for heat dissipation unit of the first embodiment of the present invention, showing that the latch device is applied to and mounted on an electronic component.
Figure 5:
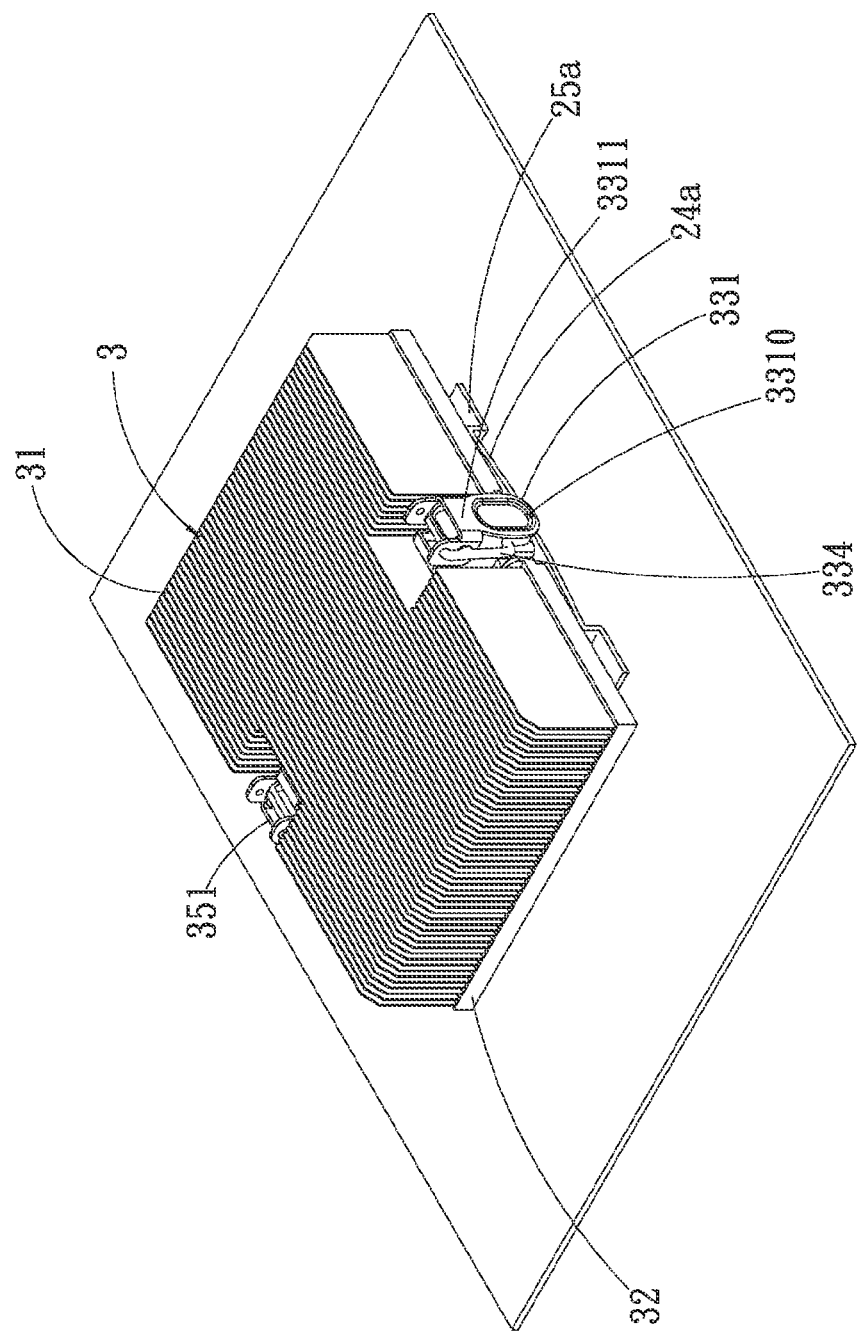
FIG. 5 is a perspective assembled view of the latch device for heat dissipation unit of the first embodiment of the present invention, showing that the latch device is applied to and mounted on the electronic component in a latched state.

Please refer to FIGS. 1, 4 and 5. FIG. 1 is a perspective exploded view of a first embodiment of the present invention. FIG. 4 is a perspective exploded view of the latch device for heat dissipation unit of the first embodiment of the present invention, showing that the latch device is applied to and mounted on an electronic component. FIG. 5 is a perspective assembled view of the latch device for heat dissipation unit of the first embodiment of the present invention, showing that the latch device is applied to and mounted on the electronic component in a latched state. Please also subsidiarily refer to FIGS. 2A, 3A and 3B. FIG. 2A is a perspective exploded view of the first and second latch members of the first embodiment of the present invention. FIG. 3A is a perspective view of the heat sink of the first embodiment of the present invention. FIG. 3B is a perspective partially sectional view of the heat sink of the first embodiment of the present invention. The latch device 1 for heat dissipation unit of the present invention is applied to and mounted on a motherboard 5 and connected with at least one heat source. In this embodiment, at least one electronic component 51 is disposed on the motherboard 5 as the heat source. The electronic component 51 is, but not limited to, such as a central processing unit or graphics processing unit for illustration purposes. The latch device 1 for heat dissipation unit includes a heat sink 3, a first elastic abutment member 2a and a second elastic abutment member 2b. The first and second elastic abutment members 2a, 2b are respectively disposed on an upper face of the motherboard 5 corresponding to each other. The electronic component 51 is positioned between the first and second elastic abutment members 2a, 2b.

The first elastic abutment member 2a has a first protrusion block 21a, a horizontal first abutment section 23a and a pair of first elastic sections 24a. The second elastic abutment member 2b has a second protrusion block 21b, a horizontal second abutment section 23b and a pair of second elastic sections 24b. The first and second abutment sections 23a, 23b are adjacent to each other and in contact with the upper face of the motherboard 5. The first and second abutment sections 23a, 23b are parallel to the upper face of the motherboard 5. The pair of first elastic sections 24a obliquely upward extends from two ends of the first abutment section 23a. In addition, a first fixed section 25a extends from a free end of each first elastic section 24a. The pair of second elastic sections 24b obliquely upward extends from two ends of the second abutment section 23b. In addition, a second fixed section 25b extends from a free end of each second elastic section 24b.

The first and second fixed sections 25a, 25b are respectively fixed on the upper face of the motherboard 5. That is, the first fixed section 25a is bent downward from the free end of the first elastic section 24a and fixed on the upper face of the motherboard 5 and the second fixed section 25b is bent downward from the free end of the second elastic section 24b and fixed on the upper face of the motherboard 5.

Figure 7:
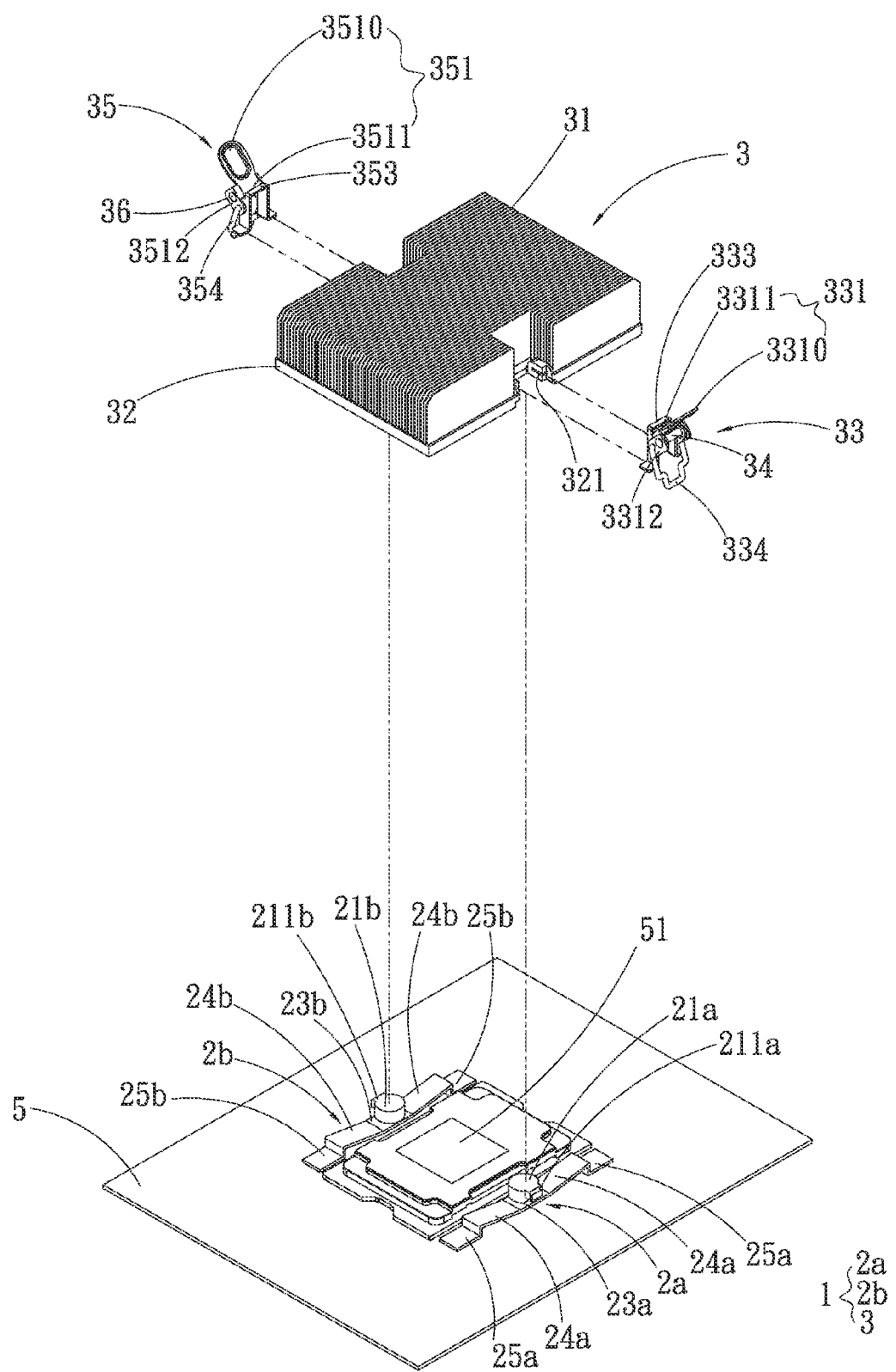
FIG. 7 is a perspective exploded view of the latch device for heat dissipation unit of the first embodiment of the present invention in another aspect, showing that the latch device is applied to and mounted on the electronic component.
Figure 7A:
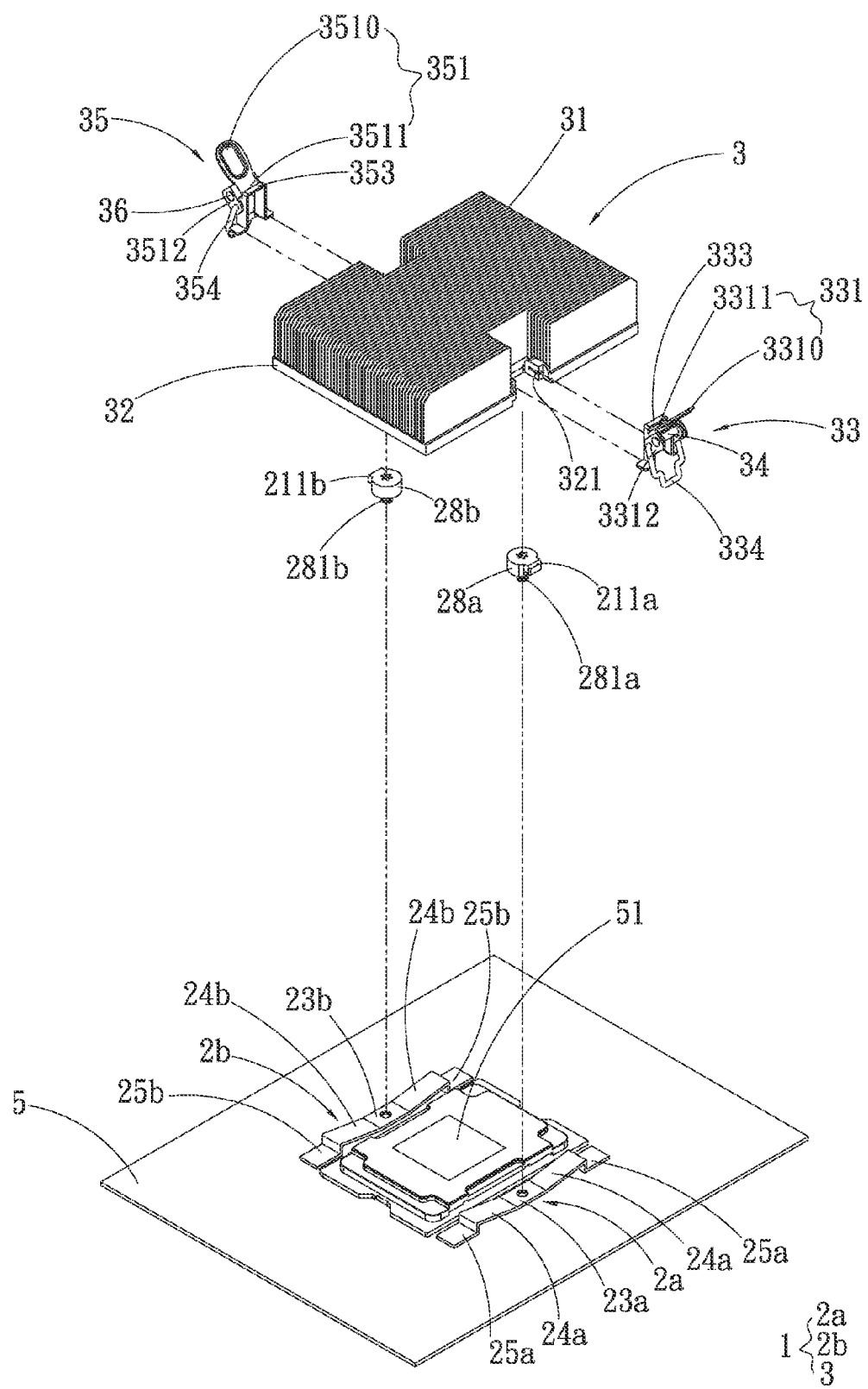
FIG. 7A is a perspective exploded view of the latch device for heat dissipation unit of the first embodiment of the present invention in still another aspect, showing that the latch device is applied to and mounted on the electronic component.

Please refer to FIGS. 1, 3A, 3B and 4. The first and second protrusion blocks 21a, 21b are respectively disposed on upper end faces of the corresponding first and second abutment sections 23a, 23b. The first protrusion block 21a is formed with a first hook section 211a and a through hole 212a. The second protrusion block 21b is formed with a second hook section 211b and a second through hole 212b. The first and second hook sections 211a, 211b are respectively formed on outer circumferences of the first and second protrusion blocks 21a, 21b and protrude therefrom. The first and second through holes 212a, 212b are respectively formed through the centers of the first and second protrusion blocks 21a, 21b. A female threaded member 26a is passed through the first through hole 212a and the corresponding first abutment section 23a and mated and tightened with a male threaded member 27a. A female threaded member 26b is passed through the second through hole 212b and the corresponding second abutment section 23b and mated and tightened with a male threaded member 27b. In practice, the first and second through holes 212a, 212b of the first and second protrusion blocks 21a, 21b and the male and female threaded members 26a, 27a, 26b, 27b can be omitted. Instead, the first and second protrusion blocks 21a, 21b are respectively directly welded on the first and second abutment sections 23a, 23b (as shown in FIG. 7). Alternatively, the first and second protrusion blocks 21a, 21b are respectively integrally formed on the upper faces of the first and second abutment sections 23a, 23b. Still alternatively, as shown in FIG. 7A, the male threaded members 27a, 27b and the first and second through holes 212a, 212b are omitted. Instead, the first and second protrusion blocks 21a, 21b are integrated with the female threaded members 26a, 26b to form a first threaded protrusion block 28a with a first hook section 211a and a second threaded protrusion block 28a with a second hook section 211b. An outer thread 281a, 281b is formed on one end of each of the first and second threaded protrusion blocks 28a, 28b. The outer threads 281a, 281b of the first and second threaded protrusion blocks 28a, 28b are securely screwed with the first and second abutment sections 23a, 23b.

The heat sink 3 includes multiple radiating fins 31, a first latch member 33, a second latch member 35, a base seat 32, a first inlay slot 321 and a second inlay slot 322. The radiating fins 31 are formed on one face of the heat sink 3. The first and second latch members 33, 35 are respectively disposed on two opposite sides of the heat sink 3. In other words, the radiating fins 31 are formed on a top face of the base seat 32 of the heat sink 3. The first and second latch members 33, 35 are respectively disposed on the two opposite sides of the heat sink 3 with the radiating fins 31 positioned between the first and second latch members 33, 35. The first and second latch members 33, 35 can be respectively correspondingly freely latched with or unlatched from the first and second hook sections 211a, 211b of the first and second protrusion blocks 21a, 21b. When latched/unlatched, the first and second elastic abutment members 2a, 2b are elastically deformed into abutment against the other face of the heat sink 3, (that is, the bottom face of the base seat 32 of the heat sink 3) or out of abutment with the other face of the heat sink 3.

In addition, the two opposite sides of the base seat 32 of the heat sink 3 are recessed to form the first and second inlay slots 321, 322. The bottom face of the base seat 32 is in contact with the first and second elastic abutment members 2a, 2b. The first latch member 33 has a first handle section 331, a first support section 333 and a first latch section 334. The second latch member 35 has a second handle section 351, a second support section 353 and a second latch section 354. The first and second handle sections 331, 351 are respectively pivotally connected with the first and second support sections 333, 353. The first and second latch sections 334, 354 are respectively movably connected with the first and second handle sections 331, 351. The first and second latch sections 334, 354 are up or down movable with the first and second handle sections 331, 351 to latch with or unlatch from the corresponding first and second protrusion blocks 21a, 21b. The bottom sections of the first and second support sections 333, 353 are respectively inserted in the corresponding first and second inlay slots 321, 322. In practice, the first and second inlay slots 321, 322 can be omitted. Instead, the bottom sections of the first and second support sections 333, 353 can be directly welded on two opposite sides of the base seat 32 of the heat sink 3. Alternatively, the first and second support sections 333, 353 can be integrally formed on the two opposite sides of the base seat 32 of the heat sink 3. Still alternatively, the first and second support sections 333, 353 can be connected with the two opposite sides of the base seat 32 of the heat sink 3 by any other connection means such as screwing, riveting, engaging, latching or welding.

According to the above arrangement, the first and second latch sections 334, 354 of the first and second latch members 33, 35 on two sides of the heat sink 3 can be latched with or unlatched from the first and second protrusion blocks 21a, 21b. Therefore, a user can barehanded securely locate the heat sink 3 on the motherboard 5 to facilitate the operation and assembling process and achieve a secure latching effect. In addition, in a latched state, the first and second abutment sections 23a, 23b apply an elastic reaction force to the first and second latch members 33, 35 so as to pull the heat sink 3 downward. At the same time, the first and second pairs of first and second elastic sections 24a, 24b of the first and second elastic abutment members 2a, 2b are pulled upward by the first and second protrusion blocks 21a, 21b along with the first and second abutment sections 23a, 23b. Therefore, the first and second elastic sections 24a, 24b are elastically deformed to upward elastically abut against the other face of the heat sink 3. Under such circumstance, the bottom face of the base seat 32 of the heat sink 3 can tightly attach to the center of the corresponding electronic component 51 (the heat source). In this case, the thermal resistance between the heat sink 3 and the electronic component 51 is reduced (or lowered) so that the heat conduction efficiency of the heat dissipation unit is enhanced to promote the heat dissipation efficiency.

Please now refer to FIGS. 2A, 2B, 3A and 3B. The structures of the respective components of the present invention will be more specifically described hereinafter with reference to the drawings. The first handle section 331 has a first handle end 3310 and a first connection end 3311. The first handle end 3310 is for a user to hold and force the first handle section 331 upward or downward. The first connection end 3311 horizontally outward extends from the first handle section 3310. Two sidewalls 3312 extend from two opposite sides of the first connection end 3311. The two sidewalls 3312 are perpendicular to the first connection end 3311. Each of the sidewalls 3312 of the first connection end 3311 is formed with a first shaft hole 3313 and a first connection hole 3314. The first support section 333 has two first leg seats 3331, two first support arms 3332 and two first connection beams 3335. The first leg seats 3331 respectively horizontally outward extend from the bottom ends of the first support arms 3332. The first connection beams 3335 are respectively formed on the top ends of the first support arms 3332. A first void 3336 is defined between the two first connection beams 3335 for the first handle section 331 to move up and down.

A first lug 3333 protrudes from one side of each of the first support arms 3332. The first lug 3333 outward extends in a direction away from one side of the heat sink 3. The first lug 3333 has a first perforation 3334. A first rotary shaft 34 is passed through the first shaft holes 3313 and the corresponding first perforations 3334. The first latch section 334 has a first latch end 3341 and two first pivoted ends 3342. The two first pivoted ends 3342 are pivotally connected to the first connection holes 3314 of the two sidewalls 3312. Via the first pivoted ends 3342, the first latch section 334 is movable about the first handle section 331 to latch the first latch end 3341 with the first protrusion block 21a or unlatch the first latch end 3341 from the first protrusion block 21a.

The second handle section 351 has a second handle end 3510 and a second connection end 3511. The second handle end 3510 is for a user to hold and force the second handle section 351 upward or downward. The second connection end 3511 horizontally outward extends from the second handle section 3510. Two sidewalls 3512 extend from two opposite sides of the second connection end 3511. The two sidewalls 3512 are perpendicular to the second connection end 3511. Each of the sidewalls 3512 of the second connection end 3511 is formed with a second shaft hole 3513 and a second connection hole 3514. The second support section 353 has two second leg seats 3531, two second support arms 3532 and two second connection beams 3535. The second leg seats 3531 respectively horizontally outward extend from the bottom ends of the second support arms 3532. The second connection beams 3535 are respectively formed on the top ends of the second support arms 3532. A second void 3536 is defined between the two second connection beams 3535 for the second handle section 351 to move up and down.

In addition, a second lug 3533 protrudes from one side of each of the second support arms 3532. The second lug 3533 outward extends in a direction away from one side of the heat sink 3. The second lug 3533 has a second perforation 3534. A second rotary shaft 36 is passed through the second shaft holes 3513 and the corresponding second perforations 3534. The second latch section 354 has a second latch end 3541 and two second pivoted ends 3542. The two second pivoted ends 3542 are pivotally connected to the second connection holes 3514 of the two sidewalls 3512. Via the second pivoted ends 3542, the second latch section 354 is movable about the second handle section 351 to latch the second latch end 3541 with the second protrusion block 21b or unlatch the second latch end 3541 from the second protrusion block 21b.

When the first and second handle ends 3310, 3510 are forcedly shifted upward, the first and second connection ends 3311, 3511 are respectively moved into the corresponding first and second voids 3336, 3536. At this time, the first and second latch members 33, 35 are unlatched from the first and second protrusion blocks 21a, 21b (as shown in FIGS.

Figure 5A:
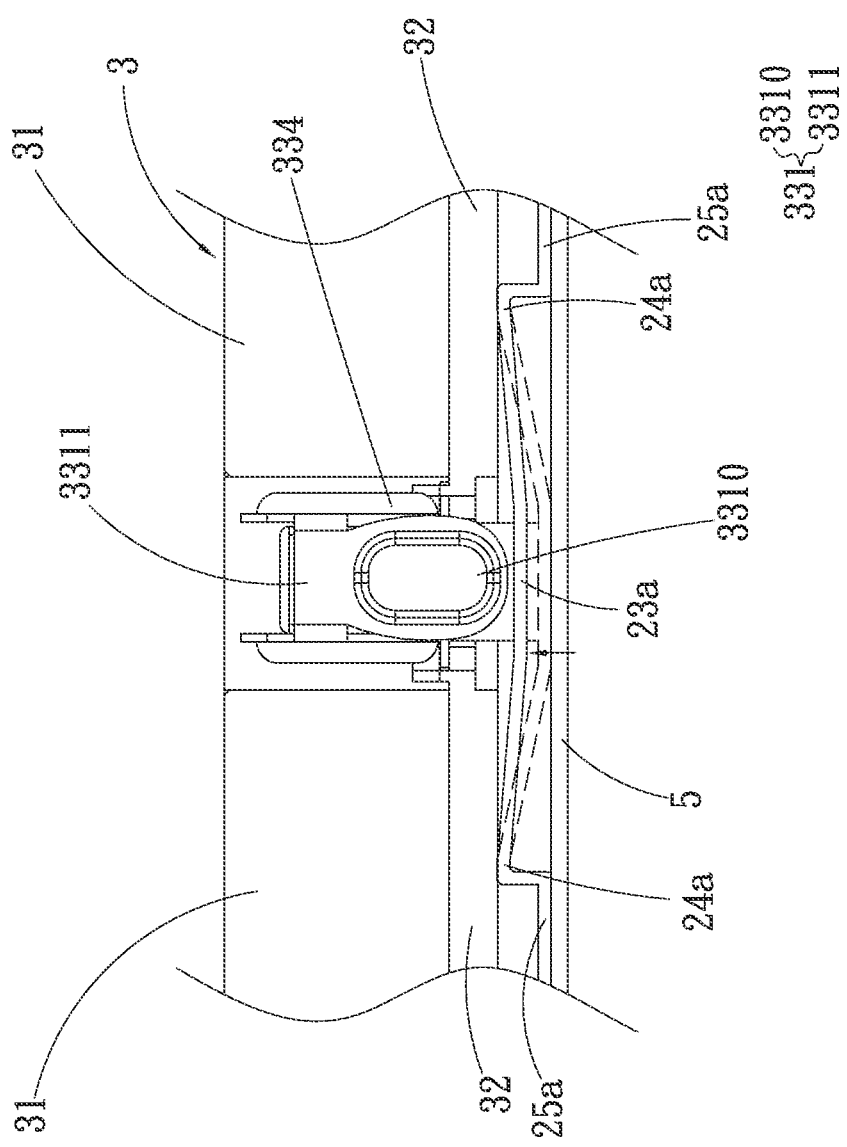
FIG. 5A is a side view of the latch device for heat dissipation unit of the first embodiment of the present invention, showing that the latch device is applied to and mounted on the electronic component in a latched state.

6 and 6A). In the case that the first and second handle ends 3310, 3510 are forcedly shifted downward, the first and second connection ends 3311, 3511 are moved upward away from the first and second voids 3336, 3536 to a position behind the first and second rotary shafts 34, 36. At this time, the first and second latch members 33, 35 are latched with the first and second protrusion blocks 21a, 21b (as shown in FIGS. 5 and 5A). In this embodiment, the first and second handle sections 331, 351 are shifted downward into the latched state and shifted upward into the unlatched state. However, the operation is not limited to the above embodiment. In practice, alternatively, the first and second handle sections 331, 351 can be shifted upward into the latched state and shifted downward into the unlatched state.

The following is a practical application of the present invention:

Please refer to FIGS. 4 and 5. Please also subsidiarily refer to FIGS. 2A and 3B. When a user mounts the heat sink 3 on the electronic component 51 of the motherboard 5, the first and second latch members 33, 35 of the heat sink 3 are respectively aligned with the first and second protrusion blocks 21a, 21b of the first and second elastic abutment members 2a, 2b on the motherboard 5. Then, the first and second latch ends 3341, 3541 of the first and second latch sections 334, 354 are positioned under the first and second hook sections 211a, 211b into contact with the hook sections 211a, 211b. Then, the user can use fingers of one hand (or fingers of two hands) to forcedly shift the first and second handle ends 3310, 3510 downward. At this time, the first and second connection ends 3311, 3511 will move upward away from the first and second voids 3336, 3536. In this case, the first and second latch sections 334, 354 and the first and second protrusion blocks 21a, 21b hooked (or latched) with the first and second latch sections 334, 354 will move upward along with the first and second connection ends 3311, 3511. At this time, the first and second abutment sections 23a, 23b will be pulled upward by the first and second protrusion blocks 21a, 21b to move upward away from the upper face of the motherboard 5 (as shown in FIG. 5A). When the first and second connection ends 3311, 3511 are respectively moved to upper side of the first and second rotary shafts 34, 36 and the first and second handle ends 3310, 3510 are moved to a position in adjacency to the corresponding first and second protrusion blocks 21a, 21b, the first and second abutment sections 23a, 23b will apply an elastic reaction force to the first and second latch members 33, 35 to pull the heat sink 3 downward. Also, the first and second elastic sections 24a, 24b are pulled (or moved) upward along with the first and second abutment sections 23a, 23b and elastically deformed to abut against the bottom face of the base seat 32 (as shown in FIG. 5A). Under such circumstance, the heat sink 3 is latched with the first and second elastic abutment members 2a, 2b (as shown in FIG. 5), whereby the center of the bottom face of the base seat 32 of the heat sink 3 is tightly attached to the corresponding electronic component 51.

Figure 6:
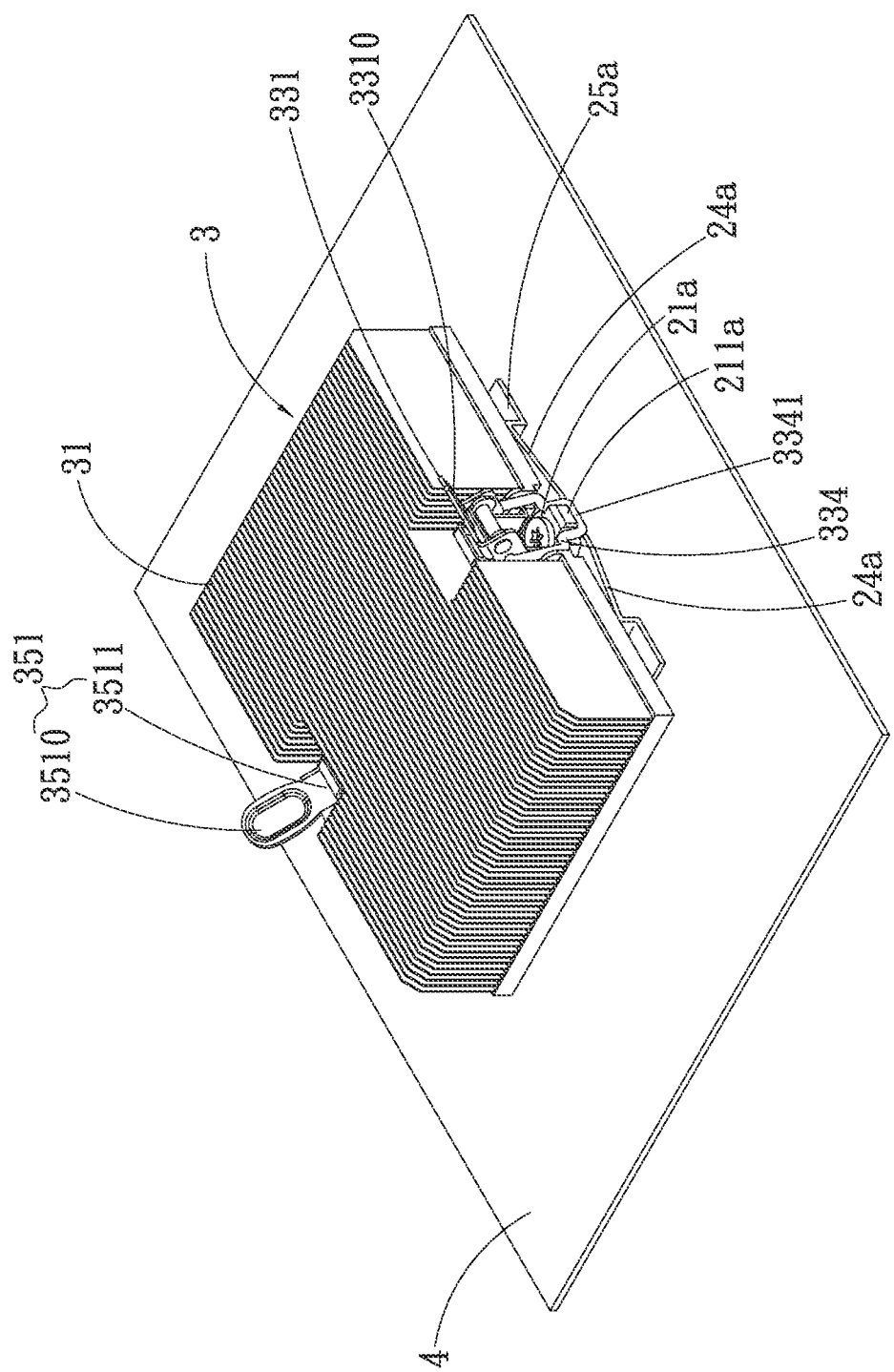
FIG. 6 is a perspective assembled view of the latch device for heat dissipation unit of the first embodiment of the present invention, showing that the latch device is applied to and mounted on the electronic component in an unlatched state.

When it is desired to detach the heat sink 3, the user can use fingers of one hand (or fingers of two hands) to forcedly shift the first and second handle ends 3310, 3510 upward. At this time, the first and second connection ends 3311, 3511 will respectively move downward into the first and second voids 3336, 3536. In this case, the first and second latch sections 334, 354 and the first and second protrusion blocks 21a, 21b hooked (or latched) with the first and second latch sections 334, 354 will move downward along with the first and second connection ends 3311, 3511 gradually into the unlatched state. At this time, the first and second abutment sections 23a, 23b will be moved downward along with the first and second protrusion blocks 21a, 21b toward the upper face of the motherboard 5 (as shown in FIG. 6A). When the first and second connection ends 3311, 3511 are respectively moved into the corresponding first and second voids 3336, 3536, the first and second elastic sections 24a, 24b are moved downward along with the first and second abutment sections 23a, 23b into contact with the upper face of the motherboard 5 and restored to their original state, (that is, not elastically deformed as shown in FIG. 6A). Under such circumstance, the heat sink 3 is unlatched from the first and second elastic abutment members 2a, 2b (as shown in FIG. 6) and can be detached.

According to the above arrangement, the latch device 1 for heat dissipation unit of the present invention can be used to effectively fix the heat sink 3 without using any hand tool (such as screwdriver or wrench). Therefore, the operation and assembling process are facilitated and the heat sink 3 can be securely latched to save assembling time.

Figure 8:
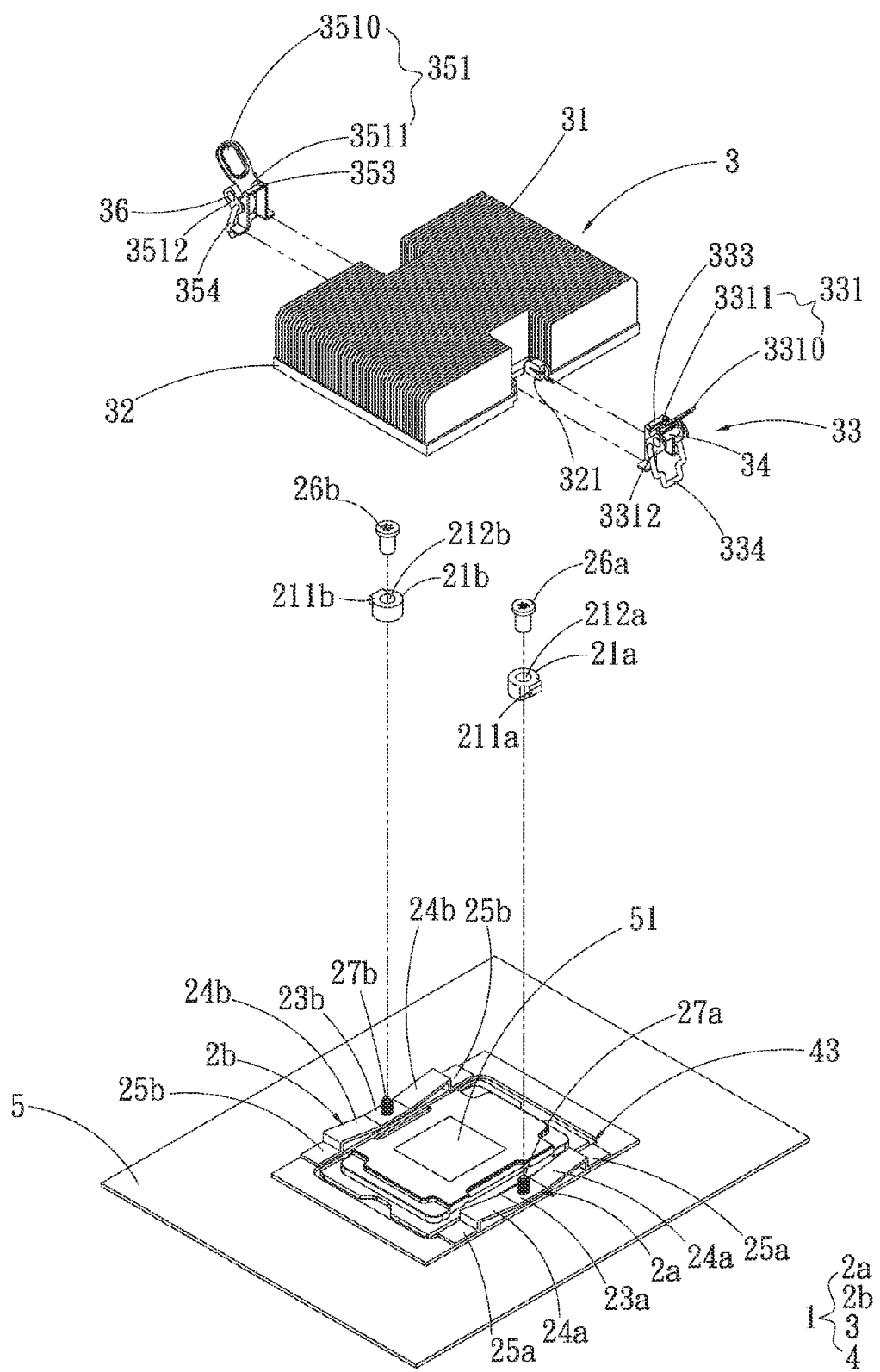
FIG. 8 is a perspective exploded view of the latch device for heat dissipation unit of a second embodiment of the present invention, showing that the latch device is applied to and mounted on the electronic component.
Figure 8A:
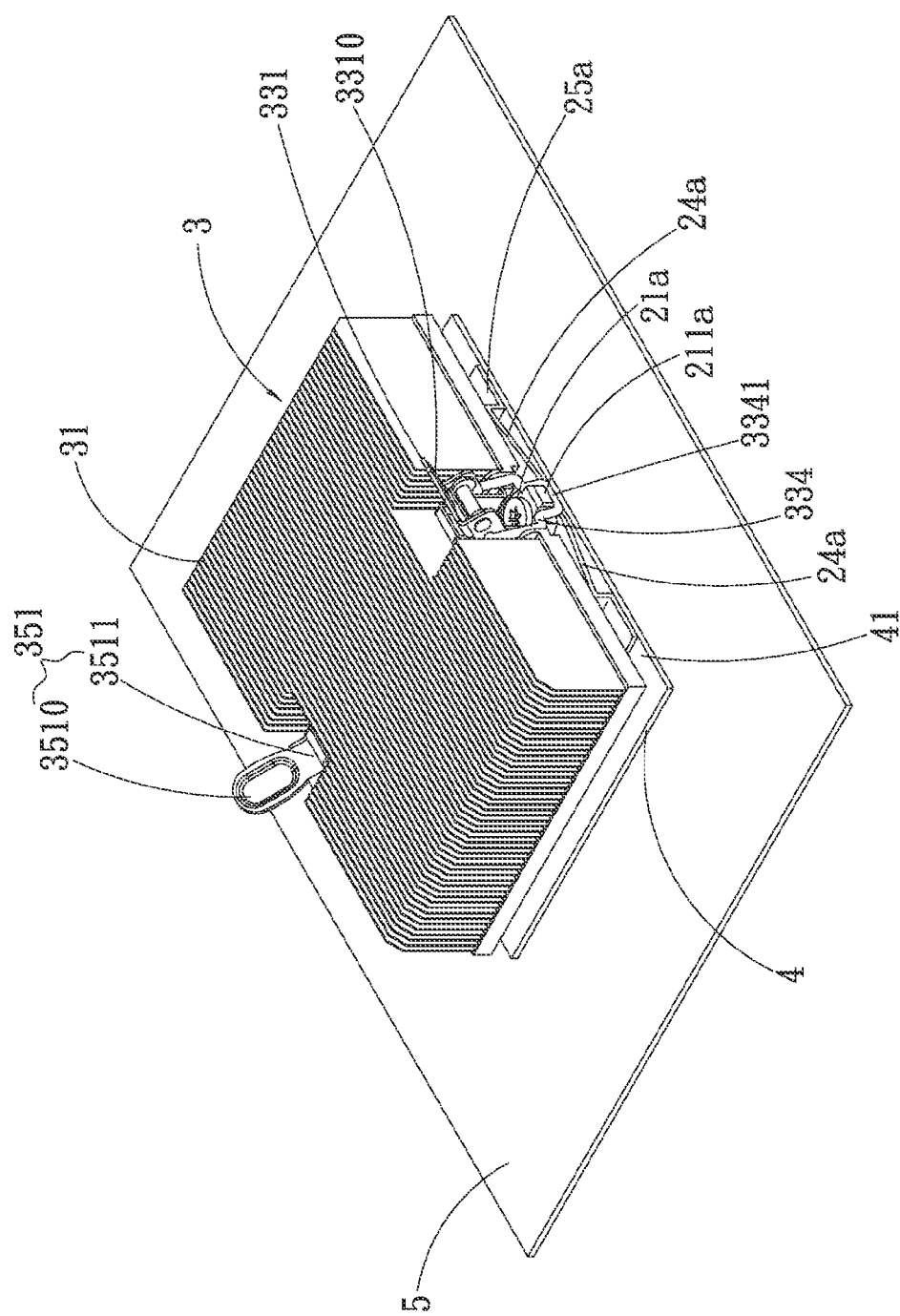
FIG. 8A is a perspective assembled view of the latch device for heat dissipation unit of the second embodiment of the present invention, showing that the latch device is applied to and mounted on the electronic component in an unlatched state.
Figure 8B:
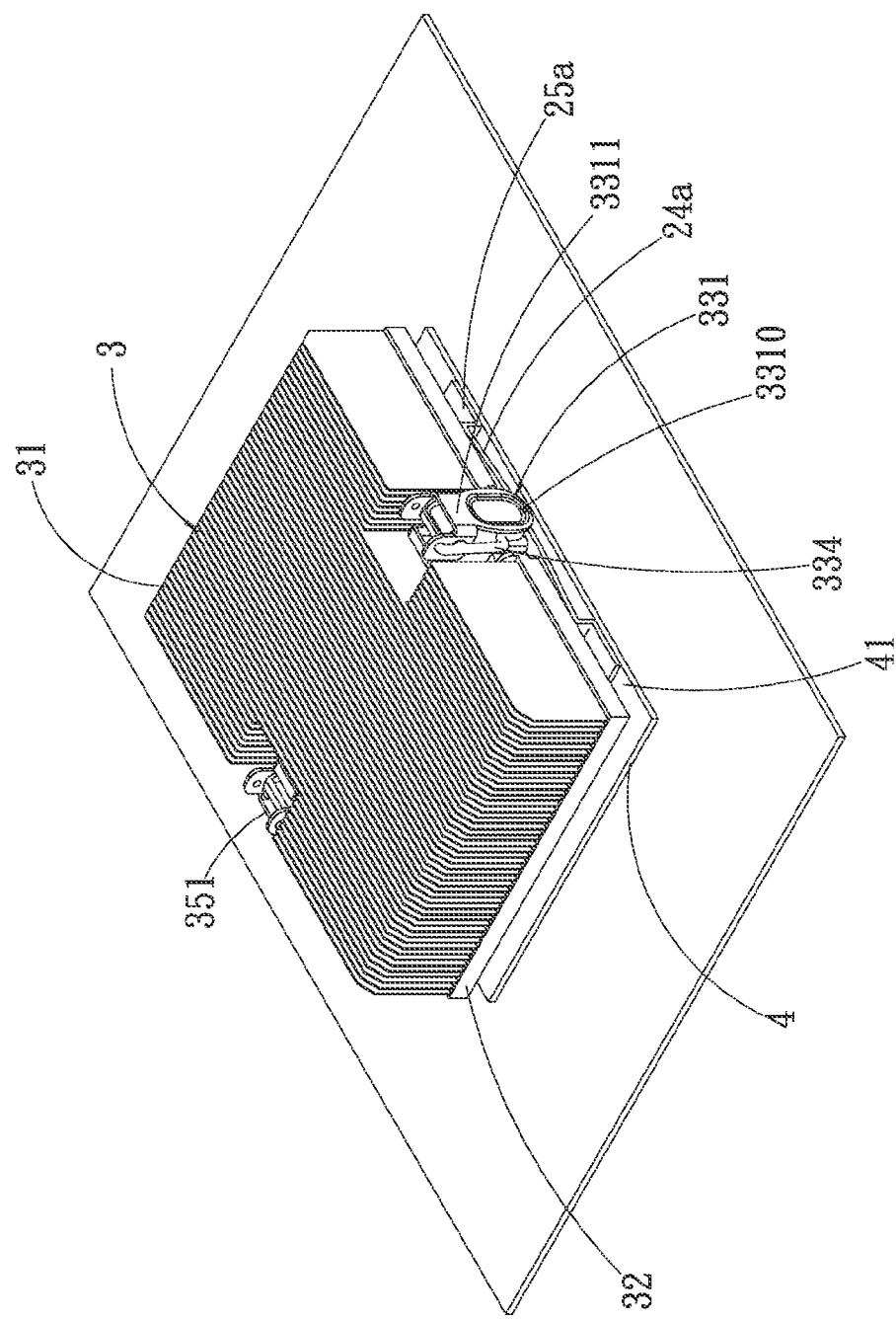
FIG. 8B is a perspective assembled view of the latch device for heat dissipation unit of the second embodiment of the present invention, showing that the latch device is applied to and mounted on the electronic component in a latched state.

Please now refer to FIG. 8, which is a perspective exploded view of the latch device for heat dissipation unit of a second embodiment of the present invention, showing that the latch device is applied to and mounted on the electronic component. The second embodiment is identical to the first embodiment in structure, connection relationship and effect and thus will not be repeatedly described hereinafter. The second embodiment is different from the first embodiment in that the latch device 1 for heat dissipation unit further includes a fixing member 4. In this embodiment, the fixing member 4 is made of metal material (such as aluminum alloy material or galvanized iron material). The fixing member 4 has a window 43 formed at the center of the fixing member 4 as a hollow. The fixing member 4 has two aspects. FIGS. 8, 8A and 8B show a first aspect of the fixing member 4. The fixing member 4 is disposed between the motherboard 5 and the first and second elastic abutment members 2a, 2b. That is, the first and second elastic abutment members 2a, 2b are respectively disposed on two opposite sides 41 of the fixing member 4 with the window 43 positioned between the first and second elastic abutment members 2a, 2b. The electronic component 51 on the motherboard 5 is framed in the fixing member 4 and positioned in the window 43. The center of the other face of the heat sink 3 is tightly attached to the electronic component 51.

Figure 9:
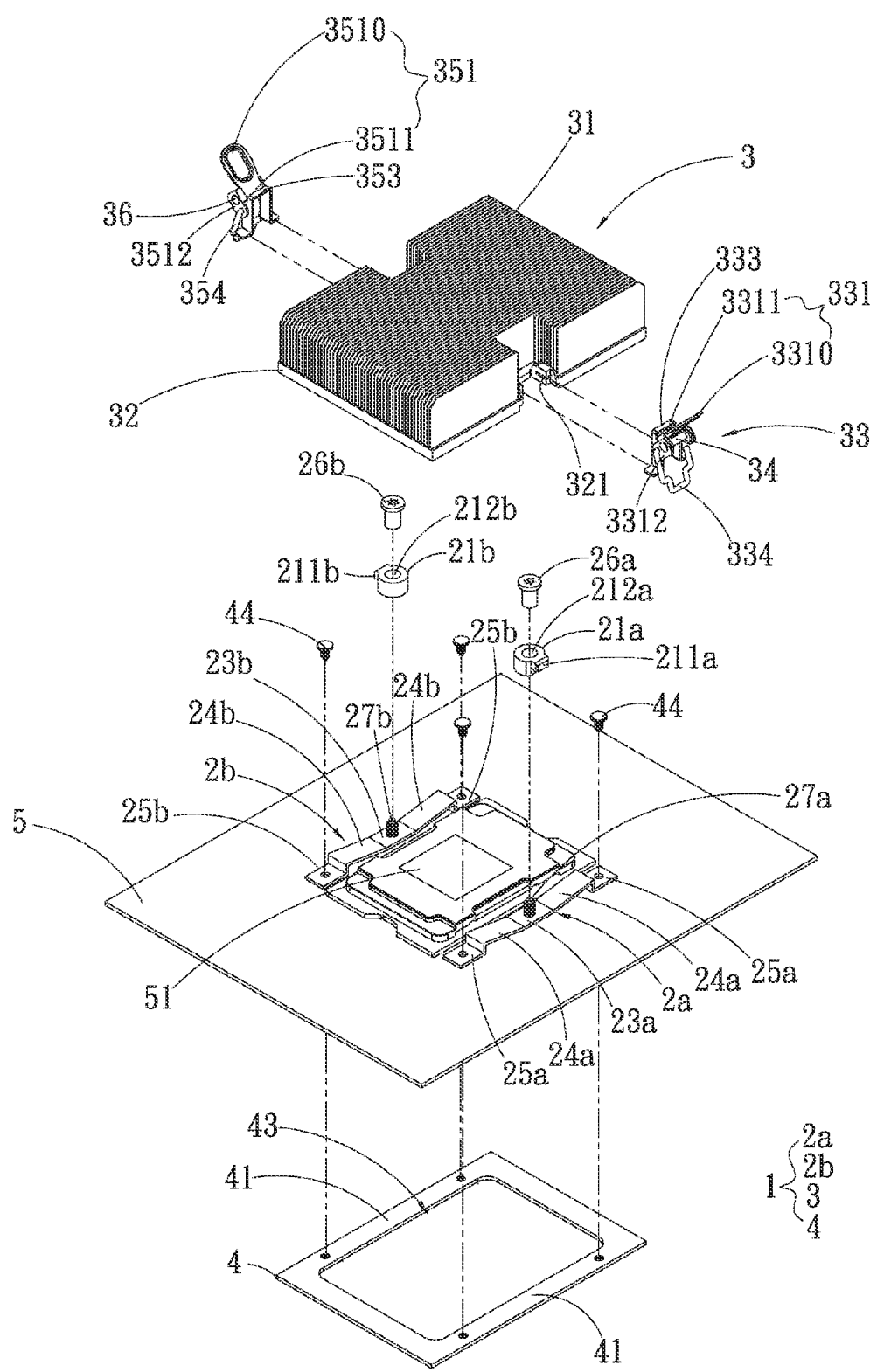
FIG. 9 is a perspective exploded view of the latch device for heat dissipation unit of the second embodiment of the present invention in another aspect, showing that the latch device is applied to and mounted on the electronic component.

FIG. 9 shows a second aspect of the fixing member 4. In the second aspect, the fixing member 4 is disposed under a lower face of the motherboard 5. The motherboard 5 is positioned between the fixing member 4 and the first and second elastic abutment members 2a, 2b with the two opposite sides 41 of the fixing member 4 aligned with the first and second elastic abutment members 2a, 2b. Multiple screws 44 are sequentially screwed through the opposite sides 41 of the fixing member 4 and the motherboard 5 and the first and second fixed sections 25a, 25b of the first and second elastic abutment members 2a, 2b.

Therefore, the fixing member 4 is disposed between the motherboard 5 and the first and second elastic abutment members 2a, 2b or under the lower face of the motherboard 5 so as to effectively enhance (or increase) the structural strength of the present invention.

The present invention has been described with the above embodiments thereof and it is understood that many changes and modifications in the above embodiments can be carried out without departing from the scope and the spirit of the invention that is intended to be limited only by the appended claims.

What is claimed is:

1. A latch device for heat dissipation unit, which is applied to and mounted on a motherboard, the latch device for heat dissipation unit comprising:
a first elastic abutment member disposed on an upper face of the motherboard and having a first protrusion block;
a second elastic abutment member disposed on the upper face of the motherboard corresponding to the first elastic abutment member, the second elastic abutment member having a second protrusion block opposite to the first protrusion block; and
a heat sink including multiple radiating fins, a first latch member and a second latch member, the radiating fins being disposed on one face of the heat sink, the first and second latch members being respectively disposed on two opposite sides of the heat sink, the first and second latch members being respectively latchable with the corresponding first and second protrusion blocks or unlatchable from the corresponding first and second protrusion blocks, whereby along with the latching or unlatching, the first and second elastic abutment members can be elastically deformed into abutment against or out of abutment with the other face of the heat sink,
wherein the first elastic abutment member has a first abutment section and a pair of first elastic sections, the pair of first elastic sections extending from two ends of the first abutment section, a first fixed section extending from a free end of each first elastic section, the first fixed sections being fixed on the upper face of the motherboard, the first protrusion block being disposed on an upper end face of the first abutment section, the first protrusion block being formed with a first hook section, the first hook section being formed on outer circumference of the first protrusion block and protruding therefrom, the first latch member being correspondingly latchable with or unlatched from the first hook section.

2. The latch device for heat dissipation unit as claimed in claim 1, wherein the second elastic abutment member has a second abutment section and a pair of second elastic sections, the pair of second elastic sections extending from two ends of the second abutment section, a second fixed section extending from a free end of each second elastic section, the second fixed sections being fixed on the upper face of the motherboard, the second protrusion block being disposed on an upper end face of the second abutment section, the second protrusion block being formed with a second hook section, the second hook section being formed on outer circumference of the second protrusion block and protruding therefrom, the second latch member being correspondingly latchable with or unlatched from the second hook section.

3. The latch device for heat dissipation unit as claimed in claim 1, wherein the heat sink further includes a base seat, a first inlay slot and a second inlay slot, the radiating fins being formed on a top face of the base seat, two opposite sides of the base seat being recessed to form the first and second inlay slots, a bottom face of the base seat being in contact with the first and second elastic abutment members.

4. The latch device for heat dissipation unit as claimed in claim 3, wherein the first latch member has a first handle section, a first support section and a first latch section, the first handle section being pivotally connected with the first support section, the first latch section being movably connected with the first handle section, the first latch section being movable with the first handle section to latch with or unlatch from the corresponding first protrusion block, a bottom section of the first support section being inserted in the corresponding first inlay slot.

5. The latch device for heat dissipation unit as claimed in claim 4, wherein the second latch member has a second handle section, a second support section and a second latch section, the second handle section being pivotally connected with the second support section, the second latch section being movably connected with the second handle section, the second latch section being movable with the second handle section to latch with or unlatch from the corresponding second protrusion block, a bottom section of the second support section being inserted in the corresponding second inlay slot.

6. The latch device for heat dissipation unit as claimed in claim 5, wherein the second handle section has a second handle end and a second connection end, two sidewalls extending from two opposite sides of the second connection end, each of the two sidewalls of the second connection end being formed with a second shaft hole and a second connection hole, the second support section having two second leg seats, two second support arms and two second connection beams, the second leg seats respectively outward extending from bottom ends of the second support arms, the second connection beams being respectively formed on top ends of the second support arms, a second void being defined between the two second connection beams for the second handle section to move up and down, a second lug protruding from one side of each of the second support arms, the second lug having a second perforation, a second rotary shaft being passed through the second shaft holes and the corresponding second perforations, the second latch section having a second latch end and two second pivoted ends, the two second pivoted ends being pivotally connected to the second connection holes of the two sidewalls, the second latch end being latchable with or unlatchable from the second protrusion block.

7. The latch device for heat dissipation unit as claimed in claim 4, wherein the first handle section has a first handle end and a first connection end, two sidewalls extending from two opposite sides of the first connection end, each of the two sidewalls of the first connection end being formed with a first shaft hole and a first connection hole, the first support section having two first leg seats, two first support arms and two first connection beams, the first leg seats respectively outward extending from bottom ends of the first support arms, the first connection beams being respectively formed on top ends of the first support arms, a first void being defined between the two first connection beams for the first handle section to move up and down, a first lug protruding from one side of each of the first support arms, the first lug having a first perforation, a first rotary shaft being passed through the first shaft holes and the corresponding first perforations, the first latch section having a first latch end and two first pivoted ends, the two first pivoted ends being pivotally connected to the first connection holes of the two sidewalls, the first latch end being latchable with or unlatchable from the first protrusion block.

8. The latch device for heat dissipation unit as claimed in claim 3, wherein the first and second inlay slots are omitted and instead, the bottom sections of the first and second support sections of the first and second latch members are respectively disposed on two opposite sides of the base seat of the heat sink.

9. The latch device for heat dissipation unit as claimed in claim 3, wherein the first and second inlay slots are omitted and instead, the first and second support sections of the first and second latch members are integrally formed on the two opposite sides of the base seat of the heat sink or connected with the two opposite sides of the base seat of the heat sink by means of screwing, riveting, engaging, latching, welding or adhesion.

10. The latch device for heat dissipation unit as claimed in claim 1, wherein at least one electronic component is disposed on the motherboard, the electronic component being positioned between the first and second elastic abutment members in tight contact with the center of the other face of the heat sink.

11. The latch device for heat dissipation unit as claimed in claim 1, further comprising a fixing member, the fixing member being disposed between the motherboard and the first and second elastic abutment members, the fixing member having a window formed at a center of the fixing member, at least one electronic component being disposed on the motherboard and positioned in the window of the fixing member, the electronic component being in tight contact with the center of the other face of the heat sink.

12. A latch device for heat dissipation unit, which is applied to and mounted on a motherboard, the latch device for heat dissipation unit comprising:
a first elastic abutment member disposed on an upper face of the motherboard and having a first protrusion block;
a second elastic abutment member disposed on the upper face of the motherboard corresponding to the first elastic abutment member, the second elastic abutment member having a second protrusion block opposite to the first protrusion block; and
a heat sink including multiple radiating fins, a first latch member and a second latch member, the radiating fins being disposed on one face of the heat sink, the first and second latch members being respectively disposed on two opposite sides of the heat sink, the first and second latch members being respectively latchable with the corresponding first and second protrusion blocks or unlatchable from the corresponding first and second protrusion blocks, whereby along with the latching or unlatching, the first and second elastic abutment members can be elastically deformed into abutment against or out of abutment with the other face of the heat sink,
wherein the heat sink further includes a base seat, a first inlay slot and a second inlay slot, the radiating fins being formed on a top face of the base seat, two opposite sides of the base seat being recessed to form the first and second inlay slots, a bottom face of the base seat being in contact with the first and second elastic abutment members,
wherein the first latch member has a first handle section, a first support section and a first latch section, the first handle section being pivotally connected with the first support section, the first latch section being movably connected with the first handle section, the first latch section being movable with the first handle section to latch with or unlatch from the corresponding first protrusion block, a bottom section of the first support section being inserted in the corresponding first inlay slot.

13. The latch device for heat dissipation unit as claimed in claim 12, wherein the second latch member has a second handle section, a second support section and a second latch section, the second handle section being pivotally connected with the second support section, the second latch section being movably connected with the second handle section, the second latch section being movable with the second handle section to latch with or unlatch from the corresponding second protrusion block, a bottom section of the second support section being inserted in the corresponding second inlay slot.

14. The latch device for heat dissipation unit as claimed in claim 13, wherein the second handle section has a second handle end and a second connection end, two sidewalls extending from two opposite sides of the second connection end, each of the two sidewalls of the second connection end being formed with a second shaft hole and a second connection hole, the second support section having two second leg seats, two second support arms and two second connection beams, the second leg seats respectively outward extending from bottom ends of the second support arms, the second connection beams being respectively formed on top ends of the second support arms, a second void being defined between the two second connection beams for the second handle section to move up and down, a second lug protruding from one side of each of the second support arms, the second lug having a second perforation, a second rotary shaft being passed through the second shaft holes and the corresponding second perforations, the second latch section having a second latch end and two second pivoted ends, the two second pivoted ends being pivotally connected to the second connection holes of the two sidewalls, the second latch end being latchable with or unlatchable from the second protrusion block.

15. The latch device for heat dissipation unit as claimed in claim 12, wherein the first handle section has a first handle end and a first connection end, two sidewalls extending from two opposite sides of the first connection end, each of the two sidewalls of the first connection end being formed with a first shaft hole and a first connection hole, the first support section having two first leg seats, two first support arms and two first connection beams, the first leg seats respectively outward extending from bottom ends of the first support arms, the first connection beams being respectively formed on top ends of the first support arms, a first void being defined between the two first connection beams for the first handle section to move up and down, a first lug protruding from one side of each of the first support arms, the first lug having a first perforation, a first rotary shaft being passed through the first shaft holes and the corresponding first perforations, the first latch section having a first latch end and two first pivoted ends, the two first pivoted ends being pivotally connected to the first connection holes of the two sidewalls, the first latch end being latchable with or unlatchable from the first protrusion block.

* * * * *